(12) United States Patent
Worl (10) Patent No.: US 9,565,749 B2
(45) Date of Patent: Feb. 7, 2017

(54) CIRCUIT OBFUSCATION USING DIFFERING DIELECTRIC CONSTANTS

(75) Inventor: Robert Tilman Worl, Maple Valley, WA (US)

(73) Assignee: THE BOEING COMPANY, Chicago, IL (US)

( * ) Notice: Subject to any disclaimer, the term of this patent is extended or adjusted under 35 U.S.C. 154(b) by 1255 days.

(21) Appl. No.: 13/453,814

(22) Filed: Apr. 23, 2012

(65) Prior Publication Data

US 2012/0210564 A1 Aug. 23, 2012

Related U.S. Application Data

(62) Division of application No. 12/174,204, filed on Jul. 16, 2008, now Pat. No. 8,188,374.

(51) Int. Cl.
| | |
|---|---|
| H05K 1/00 | (2006.01) |
| H05K 1/02 | (2006.01) |
| H01P 1/00 | (2006.01) |
| H05K 1/03 | (2006.01) |

(52) U.S. Cl.
CPC .............. *H05K 1/024* (2013.01); *H01P 1/00* (2013.01); *H05K 1/0275* (2013.01); *H05K 1/0306* (2013.01); *H05K 2201/0187* (2013.01); *H05K 2201/09318* (2013.01); *H05K 2201/09727* (2013.01); *Y10T 29/49016* (2015.01); *Y10T 29/49018* (2015.01); *Y10T 29/49117* (2015.01); *Y10T 29/49155* (2015.01)

(58) Field of Classification Search
CPC ......... H01P 1/00; H05K 1/024; H05K 1/0275; H05K 1/0306
USPC ....... 29/825, 830, 846, 592.1, 600; 174/255, 174/264–265
See application file for complete search history.

(56) References Cited

U.S. PATENT DOCUMENTS

| | | | |
|---|---|---|---|
| 5,117,457 A | 5/1992 | Cornerford | |
| 5,185,717 A | 2/1993 | Mori | |
| 5,224,265 A * | 7/1993 | Dux et al. ........................ | 29/852 |
| 5,369,299 A | 11/1994 | Byrne | |
| 5,389,738 A | 2/1995 | Piosenka | |
| 5,406,630 A | 4/1995 | Piosenka | |
| 6,049,145 A | 4/2000 | Austin | |
| 6,556,169 B1 * | 4/2003 | Fukuura et al. ....... | 343/700 MS |
| 6,970,360 B2 | 11/2005 | Sinha | |
| 7,015,823 B1 | 3/2006 | Gillen | |
| 7,277,056 B1 * | 10/2007 | Thiam et al. .......... | 343/700 MS |
| 7,280,370 B2 | 10/2007 | Chan | |
| 8,188,374 B2 * | 5/2012 | Worl ............................. | 174/258 |
| 2003/0203174 A1 | 10/2003 | McCarthy et al. | |
| 2008/0053689 A1 | 3/2008 | Wu et al. | |
| 2008/0110017 A1 * | 5/2008 | Hara ............................... | 29/830 |
| 2009/0004881 A1 | 1/2009 | Chen | |

* cited by examiner

Primary Examiner — Minh Trinh

(57) ABSTRACT

An obfuscated radio frequency circuit may be manufactured to include a metallization layer, and a dielectric layer under the metallization layer. The dielectric layer may be made up of a plurality of dielectric substrates having different dielectric constants to obfuscate functions of the circuit.

14 Claims, 6 Drawing Sheets

CIRCUIT OBFUSCATION USING DIFFERING DIELECTRIC CONSTANTS

RELATED APPLICATIONS

This application is a divisional application of, and claims priority to, U.S. application Ser. No. 12/174,204, filed Jul. 16, 2008, which is hereby incorporated by reference in its entirety.

FIELD OF THE DISCLOSURE

This disclosure relates to obfuscated circuits and to their methods of manufacture.

BACKGROUND

Generally, in the case of reverse engineering a microwave circuit, a visual inspection is all that is necessary due to the strong relationship of circuit function to circuit metal geometry. Through visual inspection of a circuit and basic knowledge of the dielectric substrate one can determine the frequency of operation, and general circuit functionality in addition to being able to copy the circuit into a simulation package and deriving further performance parameters. Microwave circuit obfuscation or tamper proofing is a key need for platforms that have a risk of being reverse engineered to determine circuit functionality, to locate areas for exploit, or simply to steal technology. Many methods currently used to achieve tamper proofing involve complex destructive methods that destroy the circuit upon detection of tampering. Many of these prior art solutions may be expensive and may not be employed in a design quickly due to their highly custom nature. Moreover, as the frequency is lowered, these types of packages may become impractical because of their large size.

An obfuscated radio frequency circuit and/or method of manufacturing such a circuit is needed to decrease one or more problems associated with one or more of the existing prior art circuits and/or methods of their manufacture.

SUMMARY

In one aspect of the disclosure, an obfuscated radio frequency circuit may comprise a metallization layer, and a dielectric layer made up of a plurality of dielectric substrates having differing dielectric constants to obfuscate functions of the circuit.

In another aspect of the disclosure, a method of manufacturing an obfuscated radio frequency circuit may be provided. In one step, a determination may be made as to what functions of a radio frequency circuit are required. In another step, the radio frequency circuit may be manufactured to have a metallization layer and a plurality of varying dielectric constants in order to achieve the required functions of the radio frequency circuit while obfuscating the functions of the manufactured radio frequency circuit.

The features, functions, and advantages that have been discussed can be achieved independently in various embodiments of the present invention or may be combined in yet other embodiments further details of which can be seen with reference to the following description and drawings.

DETAILED DESCRIPTION

The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1:
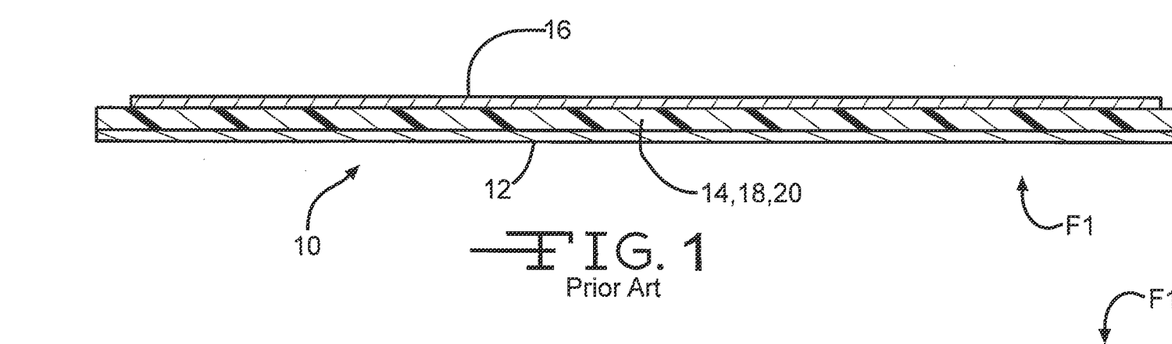
FIGS. 1 and 1A respectively show side and top views of one embodiment of an existing non-obfuscated circuit.
Figure 1A:
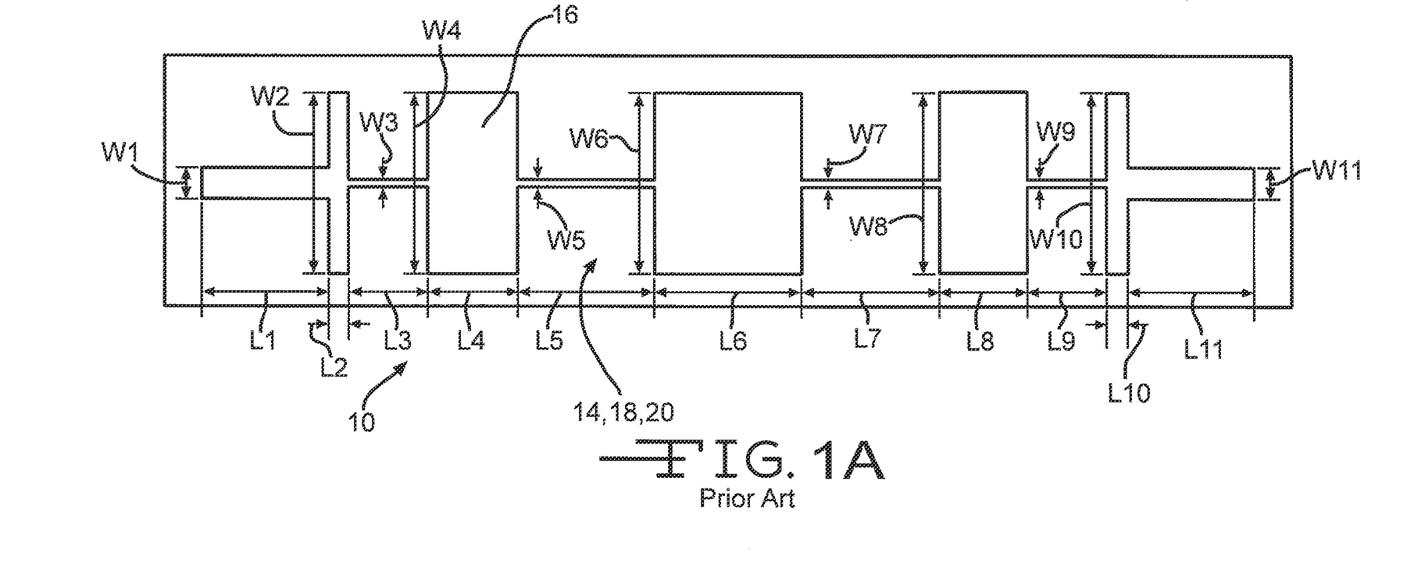

FIGS. 1 and 1A respectively show side and top views of one embodiment of a prior art non-obfuscated circuit 10. The prior art circuit 10 may comprise a filter, a matching network, an LC network, a coupler, a hybrid, a power divider, a termination, an antenna element, and/or any other type of circuit or combination of circuit elements. As shown in FIGS. 1 and 1A, the prior art circuit 10 may comprise a ground plane 12, a dielectric layer 14, and a metallization layer 16. The dielectric layer 14 may be disposed between the ground plane 12 and the metallization layer 16, and may comprise a single dielectric substrate 18 having a single dielectric constant 20 throughout the dielectric layer 14. The metallization layer 16 may be made of any type of conductive material.

As shown in FIG. 1A, the metallization layer 16 may comprise varying width portions W1-W11 having varying lengths L1-L11. The length portions L1 and L11 may comprise ports of the circuit 10, while the length portions L2-L10 may comprise sections of the circuit 10. Because the prior art circuit 10 utilizes a metallization layer 16 made up of a single dielectric substrate 18 having a single dielectric constant 20, the function F1 of the prior art circuit 10 may be easily ascertained by one of ordinary skill in the art. This may be done by simple reverse engineering of the prior art circuit 10 by measuring the varying width portions W1-W11 and varying lengths L1-L11 with basic knowledge of the single dielectric constant 20. For instance, if the function F1 of the prior art circuit 10 is to function as a stepped impedance filter, or to have any other types of function or functions, this may be easily ascertained through reverse engineering.

Figure 2:
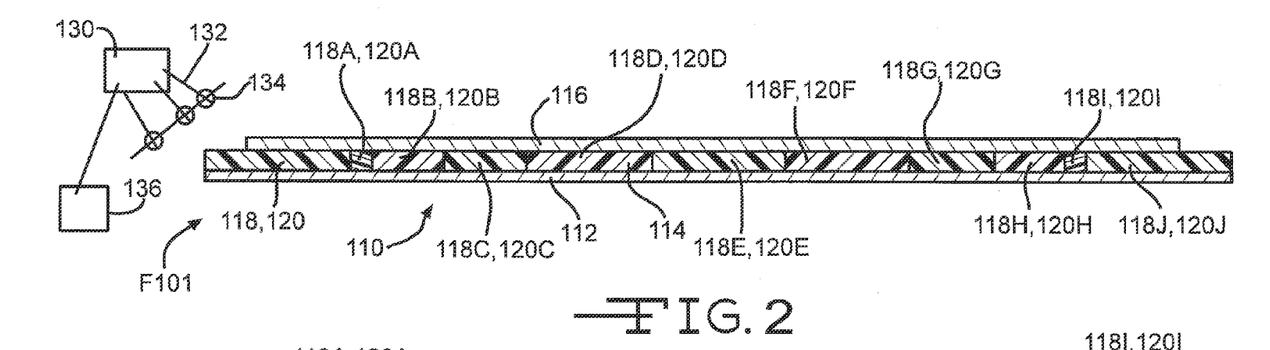
FIGS. 2 and 2A respectively show side and top views of one embodiment under the disclosure of an obfuscated radio frequency circuit.
Figure 2A:
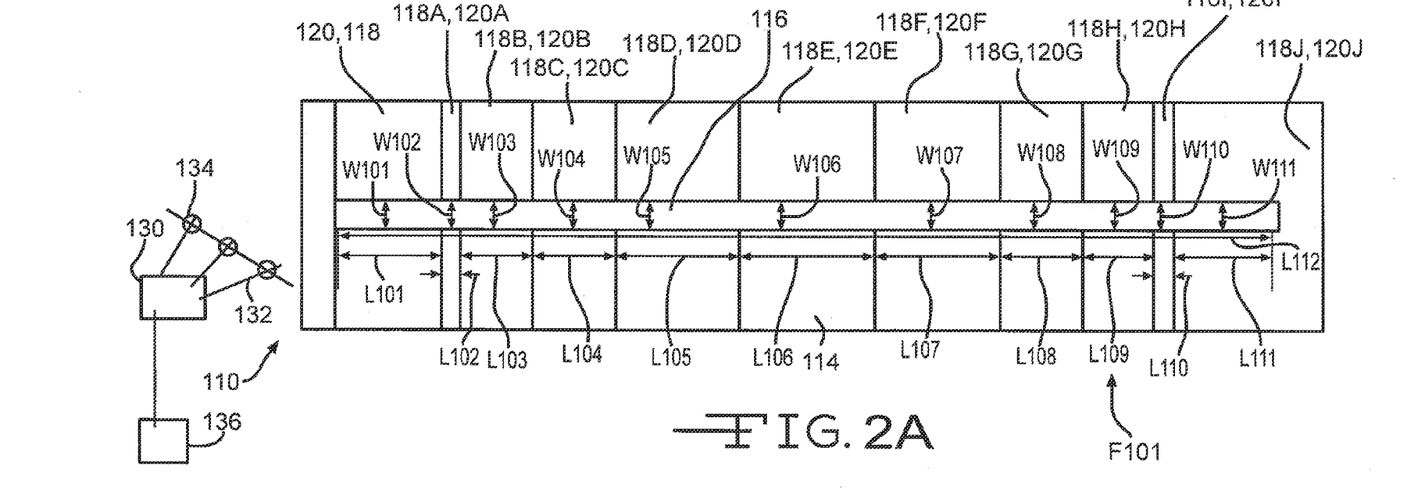

FIGS. 2 and 2A respectively show side and top views of one embodiment under the disclosure of an obfuscated radio frequency circuit 110. The obfuscated radio frequency circuit 110 may comprise a filter, a matching network, a LC network, a coupler, a hybrid, a power divider, a termination, an antenna element, and/or any other type of circuit or combination of circuit elements. As shown in FIGS. 2 and 2A, the obfuscated radio frequency circuit 110 may comprise a ground plane 112, a dielectric layer 114, and a metallization layer 116. The dielectric layer 114 may be disposed between the ground plane 112 and the metallization layer 116. The dielectric layer 114 may utilize a plurality of dielectric substrates 118-118J having two or more differing dielectric constants 120-120J to obfuscate functions F101 of the radio frequency circuit 110. The amount of dielectric material used for the dielectric substrates 118-118J may be so small that measuring the amount of dielectric material would be extremely difficult to near impossible. As a result, it may be extremely difficult for one of ordinary skill in the art to reverse engineer the circuit 110. The metallization layer 116 may be made of any type of conductive metal.

As shown in FIG. 2A, the metallization layer 116 may comprise substantially uniform width portions W101-W111 along respective length portions L101-L111 collectively forming the entire length L112 of the metallization layer 116. The length portions L101 and L111 may comprise ports of the circuit 110, while the length portions L102-L110 may comprise sections of the circuit 110. Despite the substantially uniform width of the width portions W101-W111, the obfuscated radio frequency circuit 110 may achieve the same function(s) F101 as the function(s) F1 of the prior art circuit 10 of FIGS. 1 and 1A while obfuscating the circuit's function(s) F101 due to the use of the plurality of dielectric substrates 118-118J having two or more differing dielectric constants 120-120J. This result is due to the inverse relationship between the dielectric constant(s) of the substrate(s) and the width(s) of the metallization layer.

For instance, the substrates 118 and 118J of the embodiment of FIGS. 2 and 2A may be chosen to have dielectric constants 120 and 120J which are substantially identical to the value of the single dielectric constant 20 of the prior art circuit 10 of FIGS. 1 and 1A. This may be as a result of the substantially uniform width of the width portions W101 and W111 of the metallization layer 116 being substantially identical in width relative to the width portions W1 and W11 of the prior art circuit 10 of FIGS. 1 and 1A. As a result, because the width dimensions W101 and W111 of the metallization layer 116 remain unchanged from the width portions W1 and W11 of the prior art circuit 10, no change may be required in the dielectric constants 120 and 120J of the substrates 118 and 118J to achieve the same function(s) F101 as the function(s) F1 of the prior art circuit 10 while obfuscating the circuit 110 and allowing only a localized area to be coated with the dielectric substrates 118-118J. In one embodiment, the substrates 118 and 118J may comprise $Ta_2O_5$. In other embodiments, the substrates 118 and 118J may comprise varying materials.

The substrates 118A, 118C, 118E, 118G, and 118I of the embodiment of FIGS. 2 and 2A may be chosen to have dielectric constants 120A, 120C, 120E, 120G, and 120I which are substantially higher in value than the single dielectric constant 20 of the prior art embodiment of FIGS. 1 and 1A. This may be as a result of the substantially uniform width portions W102, W104, W106, W108, and W110 of the metallization layer 116 being substantially smaller in width than width portions W2, W4, W6, W8, and W10 of the prior art circuit 10. As a result, due to the inverse relationship between the width portions W102, W104, W106, W108, and W110 of the metallization layer 116 and the dielectric constants 120A, 120C, 120E, 120G, and 120I of the substrates 118A, 118C, 118E, 118G, and 118I, higher dielectric constants of those substrates may be utilized to offset the variance in width dimensions over width dimensions W2, W4, W6, W8, and W10 of the prior art circuit 10 in order to achieve the same function(s) F101 as the functions(s) F1 of the prior art circuit 10 while obfuscating the circuit 110. In one embodiment, the substrates 118A, 118C, 118E, 118G, and 118I may comprise $MgAl_3O_4$. In other embodiments, the substrates 118A, 118C, 118E, 118G, and 118I may comprise varying materials.

The substrates 118B, 118D, 118F, and 118H of the embodiment of FIGS. 2 and 2A may be chosen to have dielectric constants 120B, 120D, 120F, and 120H which are substantially lower in value than the single dielectric constant 20 of the prior art circuit 10 of FIGS. 1 and 1A. This may be a result of the substantially uniform width portions W103, W105, W107, and W109 of the metallization layer 116 being substantially larger in width than width portions W3, W5, W7, and W9 of the prior art circuit 10. As a result, due to the inverse relationship between the width portions W103, W105, W107, and W109 of the metallization layer 116 and the dielectric constants 120B, 120D, 120F, and 120H of the substrates 118B, 118D, 118F, and 118H, smaller dielectric constants of those substrates may be utilized to offset the variance in width dimensions relative to the width of width portions W3, W5, W7, and W9 of the prior art circuit 10 in order to achieve the same function(s) F101 as the function(s) F1 of the prior art circuit 10 while obfuscating the circuit 110. It should be noted that to achieve similar functionality in the obfuscated circuit 110 relative to the prior art circuit 10, the lengths of length portions L102-L110 of the obfuscated circuit 110 may vary relative to the lengths of length portions L2-L10 of the prior art circuit 10 due to the effect that varied dielectric constants 120A-120I may have on the lengths of the circuit sections. In one embodiment, the substrates 118B, 118D, 118F, and 118H may comprise $2SiO_2$. In other embodiments, the substrates 118B, 118D, 118F, and 118H may comprise varying materials. In still other embodiments, in order to achieve obfuscation of the function(s) of a circuit, any number of substrates may be chosen to have varying dielectric constants.

Figure 3:
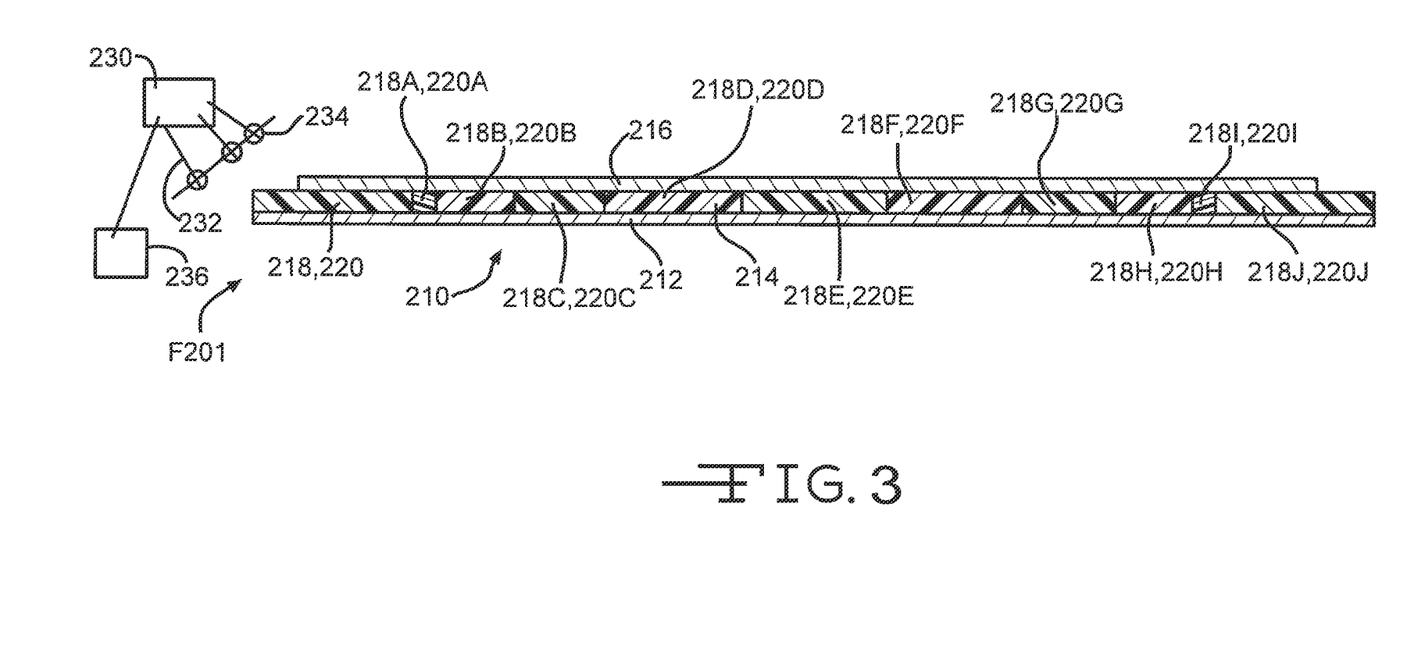
FIGS. 3 and 3A respectively show side and top views of one embodiment under the disclosure of an obfuscated radio frequency circuit.
Figure 3A:
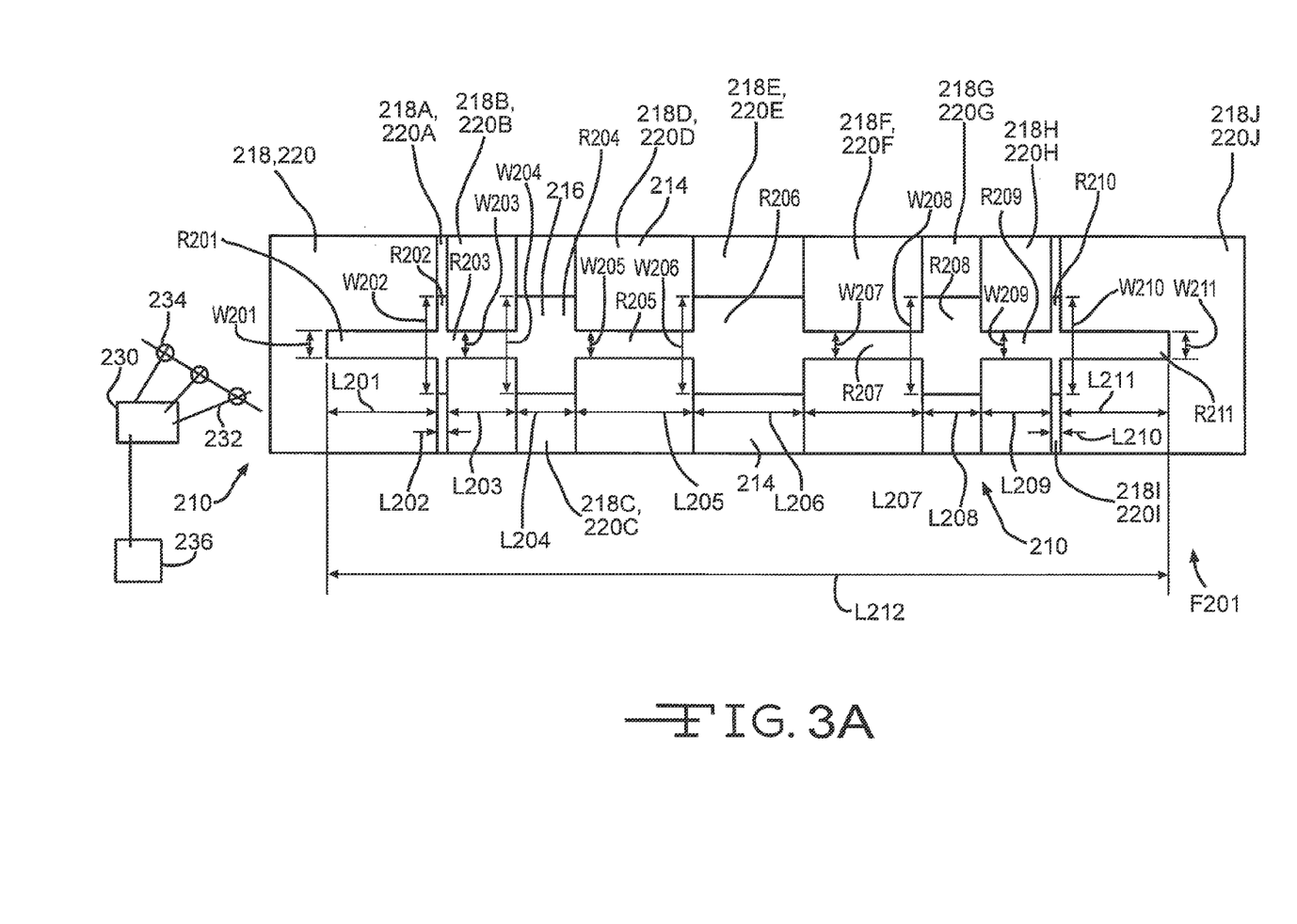

FIGS. 3 and 3A respectively show side and top views of one embodiment under the disclosure of an obfuscated radio frequency circuit 210. The obfuscated radio frequency circuit 210 may comprise a filter, a matching network, an LC network, a coupler, a hybrid, a power divider, a termination, an antenna element, and/or any other type of circuit or combination of circuit elements. As shown in FIGS. 3 and 3A, the obfuscated radio frequency circuit 210 may comprise a ground plane 212, a dielectric layer 214, and a metallization layer 216. The dielectric layer 214 may be disposed between the ground plane 212 and the metallization layer 216. The dielectric layer 214 may utilize a plurality of dielectric substrates 218-218J having two or more differing dielectric constants 220-220J to obfuscate function(s) F201 of the radio frequency circuit 210. The metallization layer 216 may be made of any type of conductive metal.

As shown in FIG. 3A, the metallization layer 216 may comprise varying width portions W201-W211 having varying lengths L201-L211 (extending collectively over length L212) forming a plurality of varying sized rectangles R201-R211. Width portions W201 and W211 and length portions L201 and L211 may be substantially identical to respective width portions W1 and W11 and respective length portions L1 and L11 of the prior art circuit 10. Width portions W202, W204, W206, W208, and W210 and length portions L202, L204, L206, L208, and L210 may be substantially smaller than respective width portions W2, W4, W6, W8, and W10 and respective length portions L2, L4, L6, L8, and L10 of the prior art circuit 10.

Width portions W203, W205, W207, and W209 and length portions L203, L205, L207, and L209 may be substantially larger than respective width portions W3, W5, W7, and W9 and respective length portions L3, L5, L7, and L9 of the prior art circuit 10. Despite the variance in widths and lengths of the metallization layer, the obfuscated radio frequency circuit 210 may achieve the same function(s) F201 as the function(s) F1 of the prior art circuit 10 of FIGS. 1 and 1A while obfuscating the circuit's function(s) F201 due to the use of the plurality of dielectric substrates 218-218J having two or more differing dielectric constants 220-220J. This result is due to the inverse relationship between the dielectric constant(s) of the substrate(s) and the width(s) and length(s) of the metallization layer.

For instance, the substrates 218 and 218J of the embodiment of FIGS. 3 and 3A may be chosen to have dielectric constants 220 and 220J which are substantially identical to the value of the single dielectric constant 20 of the prior art circuit 10 of FIGS. 1 and 1A because, as discussed above, the width portions W201 and W211 and length portions L201 and L211 may be substantially identical to respective width portions W1 and W11 and respective length portions L1 and L11 of the prior art circuit 10. As a result, because the dimensions of those portions of the metallization layer remained unchanged, no change may be required in the dielectric constants of the substrates under those portions to achieve the same function(s) F201 as the function(s) F1 of the prior art circuit 10 while obfuscating the circuit 210. It should be noted that varying materials may be used for the substrates 218 and 218J which may be different than the materials of the substrates of the embodiments of FIGS. 1 and 1A and FIGS. 2 and 2A in order to achieve the same functionality.

The substrates 218A, 218C, 218E, 218G, and 218I of the embodiment of FIGS. 3 and 3A may be chosen to have dielectric constants 220A, 220C, 220E, 220G, and 220I which are substantially higher in value than the single dielectric constant 20 of the prior art circuit 10 of FIGS. 1 and 1A because, as discussed above, the width portions W202, W204, W206, W208, and W210 and length portions L202, L204, L206, L208, and L210 may be substantially smaller than respective width portions W2, W4, W6, W8, and W10 and respective length portions L2, L4, L6, L8, and L10 of the prior art circuit 10. As a result, due to the inverse relationship between the width(s) and length(s) of the metallization layer and the dielectric constant(s) of the substrate(s), higher dielectric constants of those substrates may be utilized to offset the variance in dimensions of those portions of the metallization layer in order to achieve the same function(s) F201 as the function(s) F1 of the prior art circuit 10 while obfuscating the circuit 210. It should be noted that varying materials may be used for the substrates 218A, 218C, 218E, 218G, and 218I which may be different than the materials of the substrates of the embodiments of FIGS. 1 and 1A and FIGS. 2 and 2A in order to achieve the same functionality.

The substrates 218B, 218D, 218F, and 218H of the embodiment of FIGS. 3 and 3A may be chosen to have dielectric constants 220B, 220D, 220F, and 220H which are substantially lower in value than the single dielectric constant 20 of the prior art circuit 10 of FIGS. 1 and 1A because, as discussed above, the width portions W203, W205, W207, and W209 and length portions L203, L205, L207, and L209 may be substantially larger than respective width portions W3, W5, W7, and W9 and respective length portions L3, L5, L7, and L9 of the prior art circuit 10. As a result, due to the inverse relationship between the width(s) and length(s) of the metallization layer and the dielectric constant(s) of the substrate(s), smaller dielectric constants of those substrates may be utilized to offset the variance in dimensions of those portions of the metallization layer in order to achieve the same function(s) F201 as the functions(s) F1 of the prior art circuit 10 while obfuscating the circuit 210. It should be noted that varying materials may be used for the substrates 218B, 218D, 218F, and 218H which may be different than the materials of the substrates of the embodiments of FIGS. 1 and 1A and FIGS. 2 and 2A in order to achieve the same functionality.

In still other embodiments, in order to achieve obfuscation of the function(s) of a circuit, any number of substrates may be chosen to have varying dielectric constants. In such manner, by varying the dielectric constants of the substrates, an obfuscated circuit may be designed to have any number of varying width and length dimensions in the metallization layer while still maintaining the same function(s) and obfuscating the circuit.

The plurality of dielectric substrates 118-118J and 218-218J of the respective embodiments of FIGS. 2-2A, and FIGS. 3-3A may have been deposited to the respective circuits 110 and 210 under the respective metallization layers 116 and 216 using a direct-write apparatus/process 130 and 230. During the direct-write apparatus/process 130 and 230, heated powders 132 and 232 may be sprayed through apertures 134 and 234 to be deposited into the circuits 110 and 210. The direct-write apparatus/process 130 and 230 may create the plurality of dielectric substrates 118-118J and 218-218J particle-by-particle without the necessity of additional post-processing, allowing for precision patterns in small areas. The patterns may be laid out using a computer 136 and 236 and the apparatus/process 130 and 230 may be automated and directed by the computer 136 and 236 in order to produce any needed complex, precision pattern of substrates 118-118J and 218-218J having varying dielectric constants 120-120J and 220-220J. The direct-write apparatus/process 130 and 230 may be done easily, quickly, at high speed, at high efficiency, and at low cost. In other embodiments, varying types of non-direct-write manufacturing apparatus/processes may be utilized to create the plurality of dielectric substrates 118-118J and 218-218J.

Figure 4:
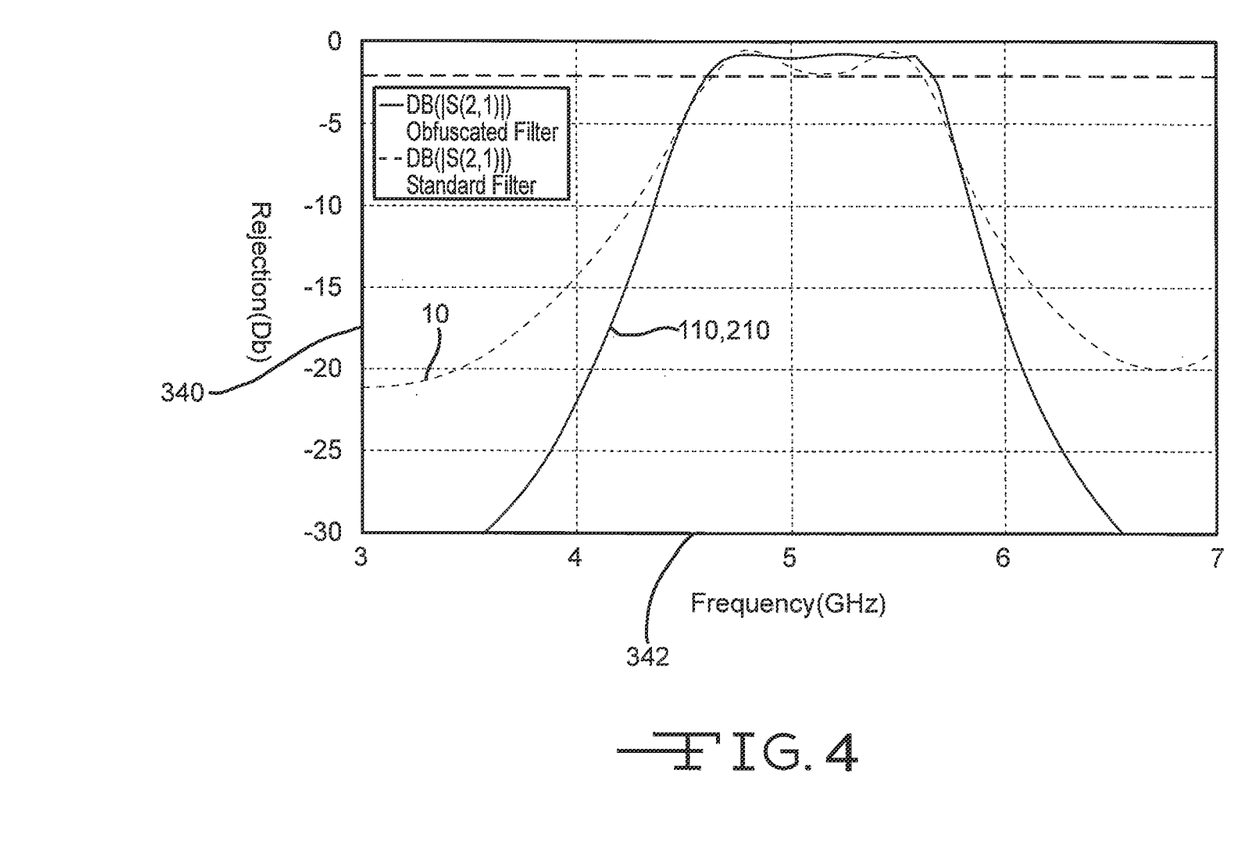
FIG. 4 shows a simulated graph charting rejection versus frequency for one embodiment of an obfuscated circuit under the disclosure relative to a prior art non-obfuscated circuit.

FIG. 4 is a simulated graph charting rejection 340 versus frequency 342 for one embodiment of an obfuscated circuit 110 and 210 under the disclosure relative to a prior art non-obfuscated circuit 10. The performance of the obfuscated circuit 110 and 210 is very similar to the performance of the prior art circuit 10. In other embodiments, the optimization algorithm used may be optimized to obtain substantially identical performances.

Figure 5:
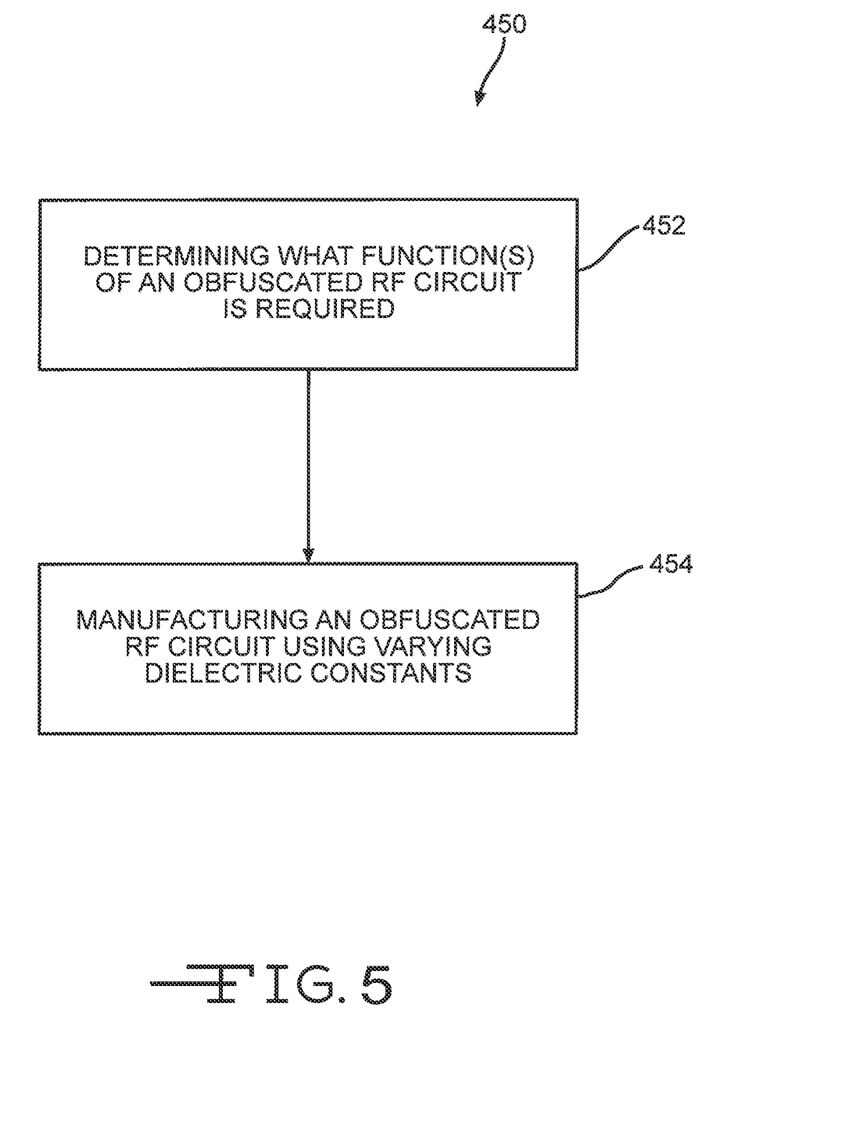
FIG. 5 is a flowchart showing one embodiment under the disclosure of a method of manufacturing an obfuscated radio frequency circuit.

FIG. 5 is a flowchart showing one embodiment under the disclosure of a method 450 of manufacturing an obfuscated radio frequency circuit 110 and 210. In step 452, it may be determined what function(s) F101 and F201 of an obfuscated radio frequency circuit 110 and 210 is required. In step 454, the radio frequency circuit 110 and 210 may be manufactured to have a plurality of varying dielectric constants 120-120J and 220-220J under a metallization layer 116 and 216 in order to achieve the required function(s) F101 and F201 of the radio frequency circuit 110 and 210 while obfuscating the function(s) F101 and F201 of the manufactured radio frequency circuit 110 and 210.

The radio frequency circuit 110 and 210 may comprise at least one of a filter, a matching network, a LC network, a coupler, a hybrid, a power divider, a termination, an antenna element, and/or another type of circuit or combination of circuit elements. In one embodiment, step 454 may comprise manufacturing the metallization layer 116 with substantially uniform width portions W101-W111 extending along an entire length L112 of the metallization layer 116. The radio frequency circuit 110 and 210 may be manufactured to comprise a plurality of dielectric substrates 118-118J and 218-218J comprising at least one of, two of, or each of $MgAl_3O_4$, $2SiO_2$, and $Ta_2O_5$. The plurality of dielectric substrates 118-118J and 218-218J may be deposited to the circuit 110 and 210 using a direct-write apparatus/process 130 and 230.

In other embodiments, the circuit 110 and 210 may be manufactured using varying non-direct write apparatus and/or processes, and/or the circuit 110 and 210 may comprise a varying number, material, dielectric constant, and/or type of substrates 118-118J and 218-218J. In another embodiment, step 454 may comprise manufacturing the metallization layer 216 to have varying width portions W201-W211 along a length L212 of the metallization layer 216. The varying width portions W201-W211 may having varying lengths L201-L211 forming a plurality of varying sized rectangles R201-R211. In still other embodiments, the metallization layer 116 and 216 may be manufactured to have varying dimensions which are chosen to vary inversely with the dielectric constants 120-120J and 220-220J of the chosen plurality of dielectric substrates 118-118J and 218-218J in order to obfuscate the function(s) of the circuit 110 and 210.

One or more embodiments of the disclosure may allow for an obfuscated circuit comprising a plurality of substrates having varying dielectric constants and a metallization layer geometry which obfuscates the function(s) of the circuit. In such manner, the disclosure may allow for varying types of obfuscated circuits having varying obfuscated functions. The obfuscated circuits may be manufactured quickly, easily, at low cost, at high efficiency, and/or may allow for one or more other types of advantages over one or more of the prior art circuits and/or methods of manufacture.

It should be understood, of course, that the foregoing relates to exemplary embodiments of the disclosure and that modifications may be made without departing from the spirit and scope of the disclosure as set forth in the following claims.

The invention claimed is:

1. A method of manufacturing an obfuscated radio frequency circuit comprising:
   forming a dielectric layer comprising an overall length dimension perpendicular to an overall width dimension, wherein the dielectric layer comprises a plurality of dielectric substrates having differing dielectric constants in order to achieve a required function of the radio frequency circuit while obfuscating the required function of the radio frequency circuit, wherein each of the plurality of dielectric substrates is disposed adjacent to one another along only one of the length dimension and the width dimension; and
   forming a metallization layer disposed on the dielectric layer.

2. The method of claim 1 wherein forming the dielectric layer further comprises manufacturing the radio frequency circuit so that the plurality of dielectric substrates are alternatively disposed against one another along only one of the length dimension and the width dimension.

3. The method of claim 1 wherein each of the plurality of dielectric substrates comprises a same width.

4. The method of claim 1 wherein each of the plurality of dielectric substrates comprises different lengths.

5. The method of claim 1 wherein each of the plurality of dielectric substrates comprises a same width and a same height, wherein at least two of the plurality of dielectric substrates comprise different lengths.

6. The method of claim 1 wherein the metallization layer comprises a substantially uniform width along an entire length of the metallization layer.

7. The method of claim 1 wherein the plurality of dielectric substrates comprises at least one of $MgAl_3O_4$, $2SiO_2$, and $Ta_2O_5$.

8. The method of claim 1 wherein the plurality of dielectric substrates comprises at least two of $MgAl_3O_4$, $2SiO_2$, and $Ta_2O_5$.

9. The method of claim 1 wherein the plurality of dielectric substrates comprises each of $MgAl_3O_4$, $2SiO_2$, and $Ta_2O_5$.

10. The method of claim 1 wherein the metallization layer comprises varying width portions along a length of the metallization layer.

11. The method of claim 10 wherein the metallization layer comprises a plurality of varying width portions have varying lengths.

12. The method of claim 11 wherein the plurality of varying width portions comprise varying sized rectangles.

13. The method of claim 1 wherein the radio frequency circuit comprises at least one of a filter, a matching network, an LC network, a coupler, a hybrid, a power divider, a termination, and an antenna element.

14. The method of claim 1 wherein forming the dielectric layer further comprises depositing the plurality of dielectric substrates using a direct-write process.

* * * * *